United States Patent [19]

Kamuro et al.

[11] Patent Number: 4,482,822

[45] Date of Patent: Nov. 13, 1984

[54] SEMICONDUCTOR CHIP SELECTION CIRCUIT HAVING PROGRAMMABLE LEVEL CONTROL CIRCUITRY USING ENHANCEMENT/DEPLETION-MODE MOS DEVICES

[75] Inventors: Setsufumi Kamuro, Yamatokoriyama; Yoshifumi Masaki, Tondabayashi, both of Japan

[73] Assignee: Sharp Kabushiki Kaisha, Osaka, Japan

[21] Appl. No.: 226,762

[22] Filed: Jan. 21, 1981

[30] Foreign Application Priority Data

Jan. 21, 1980 [JP] Japan ............................. 55-6164[U]
Jan. 21, 1980 [JP] Japan ................................ 55-5988

[51] Int. Cl.³ .................... H03K 19/094; H03K 19/21
[52] U.S. Cl. ................................. 307/468; 307/471; 307/463
[58] Field of Search ............... 307/574, 575, 264, 304, 307/270, 449, 463, 450, 451, 468, 469, 471; 365/94, 100, 103, 104

[56] References Cited

U.S. PATENT DOCUMENTS

| | | | |
|---|---|---|---|
| 4,069,430 | 1/1978 | Masuda | 307/270 |
| 4,074,238 | 2/1978 | Masuda | 365/104 |
| 4,084,105 | 4/1978 | Teranishi et al. | 307/468 X |
| 4,144,587 | 3/1979 | Miyakawa et al. | 365/104 X |
| 4,157,480 | 6/1979 | Edwards | 307/471 X |
| 4,208,727 | 6/1980 | Redwine et al. | 365/104 X |
| 4,323,846 | 4/1982 | Haraszti | 307/304 |

FOREIGN PATENT DOCUMENTS 121690 3/1978 Japan ................................. 307/570

OTHER PUBLICATIONS

Richman, *Characteristics and Operation of MOS Field-Effect Devices;* McGraw-Hill, Inc.; 1967; pp. 114–118.
Williams et al., "Read-Only Storage Data Inversion for Speed Enhancement"; IBM Tech. Discl. Bull.; vol. 22, No. 8B, pp. 3793–3794; 1/18/80.
S. C. Lewis and J. E. Rock, "Noise Filter for FET Input Circuit", IBM Tech. Bull., vol. 22, No. 4, Sep. 1979, pp. 1407 to 1408.

*Primary Examiner*—Larry N. Anagnos
*Attorney, Agent, or Firm*—Birch, Stewart, Kolasch & Birch

[57] ABSTRACT

A chip selection circuit connected to select one of a plurality of semiconductor circuits including at least one memory circuit for addressing purposes, comprises first and second circuit elements directly coupled to each other at a point, at least one of the first and second circuit elements comprising an MOS transistor where the gate electrode is connected to the source electrode, a power source being applied between the first and second circuit elements by the application of a first voltage to the first circuit element and a second voltage to the second circuit element, and an exclusive AND gate circuit provided for receiving the output from the point and chip selection enabling signals to provide chip selection signals.

9 Claims, 5 Drawing Figures

SEMICONDUCTOR CHIP SELECTION CIRCUIT HAVING PROGRAMMABLE LEVEL CONTROL CIRCUITRY USING ENHANCEMENT/DEPLETION-MODE MOS DEVICES

BACKGROUND OF THE INVENTION

The present invention relates to a semiconductor chip selection circuit and more particularly to a metal oxide semiconductor field effect mode transistor (MOS FET) chip selection circuit.

In connecting a plurality of semiconductor circuits or memory circuits, a chip selection circuit is needed for selecting one of them for addressing purposes by application of selection signals so that a desired operation may be executed by the selected memory circuit.

SUMMARY OF THE INVENTION

Accordingly, it is an object of the present invention to provide an improved semiconductor chip selection circuit.

It is another object of the present invention to provide an improved MOS FET chip selection circuit operated by an improved level control circuit.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, a chip selection circuit is connected to select one of a plurality of semiconductor circuits inclusive of at least one memory circuit for addressing purposes. The chip selection circuit comprises first and second circuit elements coupled to each other at a point, at least one of the first and second circuit elements comprising an MOS transistor having its gate electrode connected to its source electrode, a power source being applied between the first and second circuit elements by application of a first voltage to the first circuit element and a second voltage to the second circuit element, and an exclusive OR gate circuit provided for receiving the output from the point, a chip selection enabling signal to provide the chip selection signals.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE INVENTION

Figure 1:
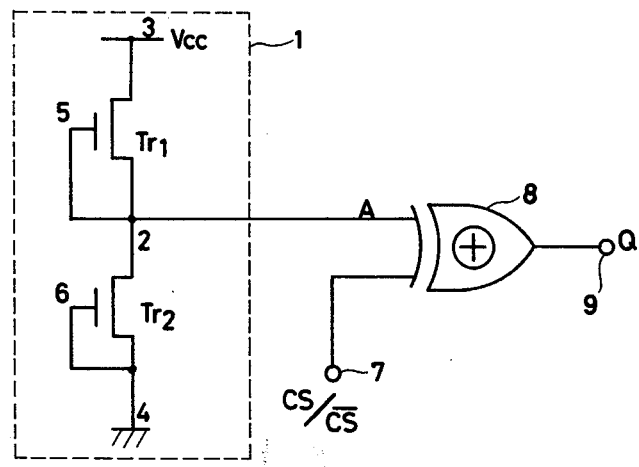
FIG. 1 is a circuit diagram of one embodiment of the present invention.

FIG. 1 shows a fundamental chip selection circuit of the present invention. A level control circuit specified by numeral 1 provides a feature of the present invention. The circuit denoted by numeral 1 is also indicated in FIG. 4.

Figure 4:
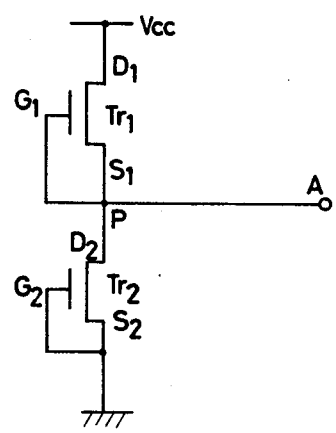
FIG. 4 is a circuit diagram of a portion of the circuit of the present invention wherein the respective transistor electrodes are labeled.

With reference to FIGS. 1 and 4, this circuit is now described. It comprises two metal oxide semiconductor field effect mode transistor (MOS FET) $Tr_1$ and $Tr_2$. The source ($S_1$ in FIG. 4) of $Tr_1$ is directly coupled to the drain ($D_2$ in FIG. 4) of $Tr_2$ at a point denoted by numeral 2 (P in FIG. 4) leading to an output line A. The drain 3 ($D_1$ in FIG. 4) of $Tr_1$ is biased by source voltage $V_{CC}$ and the source 4 ($S_2$ in FIG. 4) is grounded.

The respective gates 5 and 6 ($G_1$ and $G_2$ in FIG. 4) of $Tr_1$ and $Tr_2$ are coupled to the respective sources 2 and 4 ($S_1$ and $S_2$ in FIG. 4). Thus, each of the transistors is placed in a nonconductive state when the transistor is of the enhancement type. When one of the transistors is of the enhancement type and the other is of a depletion type, the point 2 is biased to $V_{CC}$ or the earth level.

When $Tr_1$ is of the depletion type and $Tr_2$ is of the enhancement type, $Tr_2$ is nonconductive so that the point 2 is biased to $V_{CC}$ through $Tr_1$ and $V_{CC}$ is applied to the output line A. When $Tr_1$ is of the enhancement type and $Tr_2$ is of the depletion type, $Tr_1$ is nonconductive so that the point 2 is grounded through $Tr_2$ and the output line A is also grounded.

The level of the output line A depends on which of the transistors is selected.

When either of the transistors is of the enhancement type, a direct current path from $V_{CC}$ to the ground is interrupted so that current consumption with the exception of leakage current is absent. When both of the transistors are N-channel, the polarity of $V_{CC}$ is positive. When P-channel, it is negative.

The output on the line A is utilized for driving the semiconductor chip selection circuit of the present invention. As described above, the level of the output on the line A can be programed dependent on the type of each of the transistors $Tr_1$ and $Tr_2$. The chip selection circuit comprises the above described level control circuit 1 and an exclusive OR gate 8. The output on the line A and chip selection enabling signals CS/$\overline{CS}$ on a terminal 7 are applied to the exclusive OR gate 8 to provide its output Q on an output terminal 9.

The chip selection enabling signals are provided dependent on a type of control to be executed by a semiconductor circuit comprising a plurality of memory circuits.

The output Q obtained by the following truth table is utilized to determine selection of one or more semiconductor chips. The output on the line A is referred to as A in this table.

TABLE 1

| A | CS/$\overline{CS}$ | Q |
|---|---|---|
| 0 | 0 | 0 |
| 0 | 1 | 1 |
| 1 | 0 | 1 |
| 1 | 1 | 0 |

As indicated by this table, the chip selection enabling signals of either a high level or a low level may be used to enable the selection of the semiconductor chips, respectively referred to as active high signals or active low signals, depending on the level of the output A. As described above, the level of the output A is defined by the type of each of the transistors $Tr_1$ and $Tr_2$. The logic level "0" or "1" is appropriately altered depending whether each of $Tr_1$ and $Tr_2$ is N-channel or P-channel.

According to a feature of the present invention a number of semiconductor circuits inclusive of memory circuits can be subjected to selection, simultaneously. For this purpose, the number of the chip selection enabling signals and the exclusive OR gates increases. As the number of signals and gates increases by one, the number of the semiconductor circuits to be selected can be doubled. A line, carrying the chip selection enabling signals, can become common to a plurality of semiconductor circuits. It is unnecessary to provide a line oriented only to a single semiconductor circuit.

Figure 2:
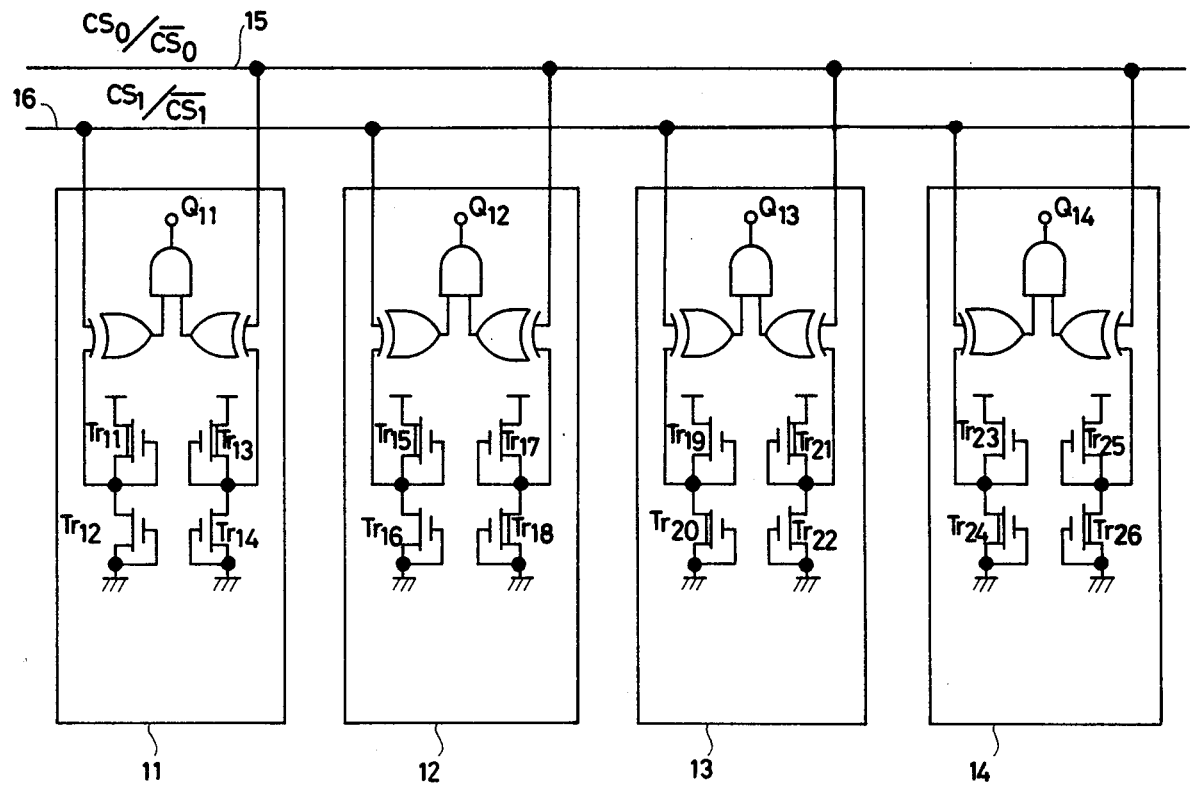
FIG. 2 is a circuit diagram of the connection of the chip selection circuit of the present invention to multiple semiconductor circuits.

FIG. 2 shows an extensive example of the chip selection circuit of the present invention connected to four semiconductor circuits 11 through 14. This example comprises two chip selection enabling signal lines 15 and 16, exclusive OR gates, MOS FETS $Tr_{11}$ through $Tr_{26}$, and output terminals $Q_{11}$ through $Q_{14}$. One of the circuits 11 to 14 is selected by a unique combination of the two chip selection enabling signals on the lines 15 and 16 and the type of programed operation of this chip selection circuit.

More particularly, in a preferred form, the circuit 11 is selected under the condition that when both of the transistors $Tr_{11}$ and $Tr_{13}$ are of the depletion type, both of the chip selection enabling signals $CSO/\overline{CSO}$ on line 15 and $CS_1/\overline{CS_1}$ on line 16 are in the low level (logic "0"). The circuit 12 is selected under the condition that when both of the transistors $Tr_{15}$ and $Tr_{18}$ are of the depletion type, the signals $CSO/\overline{CSO}$ are in the high level (logic "1") and the signals $CS_1/\overline{CS_1}$ are in the low level.

The circuit 13 is selected in the case where when both of the transistors $Tr_{20}$ and $Tr_{21}$ are of the depletion type, the signals $CSO/\overline{CSO}$ are of the low level and the signals $CS_1/\overline{CS_1}$ are of the high level. The circuit 14 is selected in the case where when both of the transistors $Tr_{24}$ and $Tr_{26}$ are of the depletion type, and the signals $CSO/\overline{CSO}$ and $CS_1/\overline{CS_1}$ are both of the high level. It is assumed that all of the transistors $Tr_{11}$ through $Tr_{26}$ are N-channel and positive logic convention is used. One of the output terminals $Q_{11}$ to $Q_{14}$ is placed in the high level (logic "1") to enable selection of one of the circuits 11 through 14.

Figure 3A:
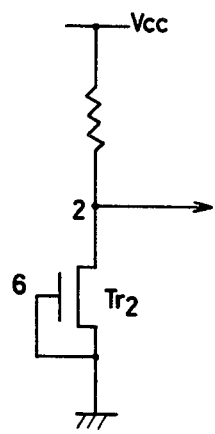
FIGS. 3(A)–3(B) are circuit diagrams of alternate embodiments of the chip selection circuit of the present invention.
Figure 3B:
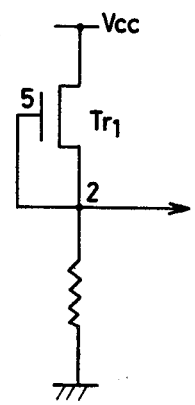

The above mentioned direct connection of a pair of transistors within the chip selection circuit is used to provide reduced current consumption. It may be permissible to allow some current consumption. FIGS. 3(A) and 3(B) show the level control circuit for this purpose.

In FIG. 3(A), while the transistor $Tr_2$ remains, the transistor $Tr_1$ is replaced by a pull-up resistor. In FIG. 3(B), while the transistor $Tr_1$ remains, the transistor $Tr_2$ is replaced by a pull-down resistor. Each of the pull-up resistor and the pull-down resistor may be constructed as a polycrystalline silicon resistor, a diffusion resistor, an enhancement type MOS FET having a high ON resistance, or a depletion type MOS FET having a high ON resistance.

According to the present invention, when a similar kind of semiconductor circuits, in particular, memory circuits are subjected to selection for addressing purposes, the chip selection signals can be treated as being equivalent to address selection signals. Then, the number of memory circuits to be subjected to selection can be easily increased.

Furthermore, the operation of the chip selection circuit of the present invention is dependent on the type of transistors, either the depletion type or the enhancement type, even when the same chip selection enabling signals in the logical levels "1" and "0" are applied. Thus, the operation of the chip selection circuit can be programed.

This kind of circuit operation is useful for the so-called mask ROM where the sort of the enhancement type or the depletion type of a transistor for the memory purposes is used to identify and discriminate the logical level "1" or "0" of data. Using the mask ROM system, the transistors for providing the chip selection circuit can be made from transistors having channels similar to those of the transistors used in constructing the memory circuit. Thus, the same mask can be used to provide a first kind of data for producing the memory circuit of ROM and a second kind of data for producing the chip selection circuit.

In particular, when a large quantity of information is shared by some memory circuits, modification of a single mask pattern enables modification of the ROM circuit and that of the programming of the chip selection circuit, using the mask ROM system.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A chip selection circuit for addressing one of a plurality of semiconductor circuits comprising:
   a first circuit element formed of an MOS transistor having an interconnected gate electrode and source electrode;
   a second circuit element connected to said first circuit element at a junction point;
   power supply means for applying power across said connected first and second circuit elements, said power supply means applying a first voltage to said first circuit element and a second voltage to said second element;
   the voltage being developed at said junction point being either said first voltage or said second voltage depending on whether said first circuit element is of the enhancement type or depletion type; and
   exclusive OR logic means receiving the voltage developed at said junction point and a chip selection enabling signal and developing a chip selection signal.

2. The circuit of claim 1 wherein said second circuit element is a resistor.

3. The circuit of claim 2, wherein said resistor is a pull-up resistor or a pull-down resistor.

4. The circuit of claim 1 wherein said first circuit element is a mask ROM type transistor.

5. The circuit of claim 1 wherein said exclusive OR logic means is an exclusive OR gate.

6. A chip selection circuit for addressing one of a plurality of semiconductor circuits comprising:

a first MOS transistor having interconnected gate source electrodes;

a second MOS transistor having interconnected gate and source electrodes and connected to said first MOS transistor at a junction point;

one of said first and second MOS transistors being of the enhancement type and the other being of the depletion type;

power supply means for applying power across said connected first and second MOS transistors, said power supply means applying a first voltage to said first MOS transistor and a second voltage to said second MOS transistor;

the voltage developed at said junction point being said first voltage when said first MOS transistor is of the depletion type and being said second voltage when said second MOS transistor is of the depletion type; and exclusive OR logic means receiving the voltage developed at said junction point and a chip selection enabling signal and developing a chip selection signal.

7. The circuit of claim 6 wherein said first and second transistors are of the mask ROM type.

8. The circuit of claim 6 wherein said exclusive OR logic means is an exclusive OR gate.

9. The circuit of claim 6 wherein each of said first and second MOS transistors also include a drain and a gate;

said first and second MOS transistors being connected source to drain at said junction point;

the source or drain of each transistor not connected to said junction point being connected to said first or second voltage.

* * * * *